(12) United States Patent
Lee

(10) Patent No.: US 7,402,500 B2
(45) Date of Patent: Jul. 22, 2008

(54) METHODS OF FORMING SHALLOW TRENCH ISOLATION STRUCTURES IN SEMICONDUCTOR DEVICES

(75) Inventor: Jae Suk Lee, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 299 days.

(21) Appl. No.: 11/181,607

(22) Filed: Jul. 13, 2005

(65) Prior Publication Data

US 2006/0014362 A1    Jan. 19, 2006

(30) Foreign Application Priority Data

Jul. 13, 2004    (KR)    ............ 10-2004-0054327

(51) Int. Cl.
*H01L 21/762* (2006.01)
(52) U.S. Cl. .................... 438/435; 438/692
(58) Field of Classification Search ............ 438/424, 438/435, 436, 692
See application file for complete search history.

(56) References Cited

U.S. PATENT DOCUMENTS

| | | | | |
|---|---|---|---|---|
| 5,077,234 A * | 12/1991 | Scoopo et al. | ............ | 438/427 |
| 5,578,518 A * | 11/1996 | Koike et al. | ............ | 438/424 |
| 5,691,215 A * | 11/1997 | Dai et al. | ............ | 438/305 |
| 5,710,076 A * | 1/1998 | Dai et al. | ............ | 438/305 |
| 5,834,358 A * | 11/1998 | Pan et al. | ............ | 438/424 |
| 5,960,297 A * | 9/1999 | Saki | ............ | 438/424 |
| 6,001,708 A * | 12/1999 | Liu et al. | ............ | 438/435 |
| 6,022,788 A * | 2/2000 | Gandy et al. | ............ | 438/424 |
| 6,037,018 A * | 3/2000 | Jang et al. | ............ | 427/579 |
| 6,048,775 A * | 4/2000 | Yao et al. | ............ | 438/427 |
| 6,121,113 A * | 9/2000 | Takatsuka et al. | ............ | 438/424 |
| 6,177,333 B1 * | 1/2001 | Rhodes | ............ | 438/433 |
| 6,225,187 B1 * | 5/2001 | Huang et al. | ............ | 438/424 |
| 6,235,608 B1 * | 5/2001 | Lin et al. | ............ | 438/424 |
| 6,261,923 B1 * | 7/2001 | Kuo et al. | ............ | 438/427 |
| 6,319,794 B1 * | 11/2001 | Akatsu et al. | ............ | 438/424 |
| 6,319,796 B1 * | 11/2001 | Laparra et al. | ............ | 438/435 |
| 6,326,309 B2 * | 12/2001 | Hatanaka et al. | ............ | 438/693 |
| 6,461,932 B1 * | 10/2002 | Wang | ............ | 438/400 |
| 6,479,361 B1 * | 11/2002 | Park | ............ | 438/353 |
| 6,528,389 B1 * | 3/2003 | Allman et al. | ............ | 438/424 |
| 6,593,208 B1 * | 7/2003 | Jin | ............ | 438/427 |
| 6,716,718 B2 * | 4/2004 | Nagatani et al. | ............ | 438/424 |
| 6,818,526 B2 * | 11/2004 | Mehrad et al. | ............ | 438/424 |
| 7,172,914 B1 * | 2/2007 | Narayanan | ............ | 438/38 |
| 2004/0077171 A1 * | 4/2004 | Chuang et al. | ............ | 438/692 |
| 2004/0262641 A1 * | 12/2004 | Rhodes | ............ | 257/202 |

* cited by examiner

*Primary Examiner*—M. Wilczewski
(74) *Attorney, Agent, or Firm*—Andrew D. Fortney

(57) ABSTRACT

Methods of forming a shallow trench isolation structures in semiconductor devices are disclosed. A disclosed method comprises forming a first oxide layer, a nitride layer, and a second oxide layer on a substrate; forming a trench defining first and second active areas by etching the second oxide layer, the nitride layer, the first oxide layer, and the substrate in a predetermined area; forming a third oxide layer along an inside of the trench; forming a fourth oxide layer to fill up the trench; forming a sacrificial oxide layer on the fourth oxide layer; and removing the sacrificial oxide layer, the fourth oxide layer, the third oxide layer, the second oxide layer, and the nitride layer so as to form the shallow trench isolation. Thus, it is possible to minimize the damage of a narrow active area when forming an element isolation area through an STI process.

7 Claims, 4 Drawing Sheets

METHODS OF FORMING SHALLOW TRENCH ISOLATION STRUCTURES IN SEMICONDUCTOR DEVICES

FIELD OF THE DISCLOSURE

The present disclosure relates generally to semiconductor fabrication, and, more particularly, to methods of forming shallow trench isolation structures in semiconductor devices.

BACKGROUND

A shallow trench isolation (STI) process for forming an element isolation region is easier than a local oxidation of silicon (LOCOS) process due to the miniaturization of semiconductor devices.

Conventionally, the STI (Shallow Trench Isolation) process proceeds as follows. First, a trench is formed by dry-etching a semiconductor substrate. The damage caused by dry-etching is curied. Then an oxide layer is formed inside of the trench by thermal oxidization in order to improve surface properties, and to achieve a rounding profile of an edge between an active area and an isolation area.

Next, an oxide layer is thickly deposited on the entire surface of the substrate to fill up the trench (a lining oxide is formed in the trench in advance of this filling). Then, the semiconductor substrate is planarized by chemical mechanical polishing.

Depending on the degree of integration of the semiconductor device being fabricated, an active area defined by the shallow trench isolation structure includes a narrow active area and a wide active area. The oxide is more thickly formed on the wide active area than on the narrow active area.

Therefore, a further process is performed between forming the oxide layers on the narrow active area and the wide active area. If a chemical mechanical polishing process is performed with focus on the wide active area, peeling damage occurs in the narrow active area. This damage deteriorates the performance and reliability of the fabricated semiconductor device.

Figure 1:
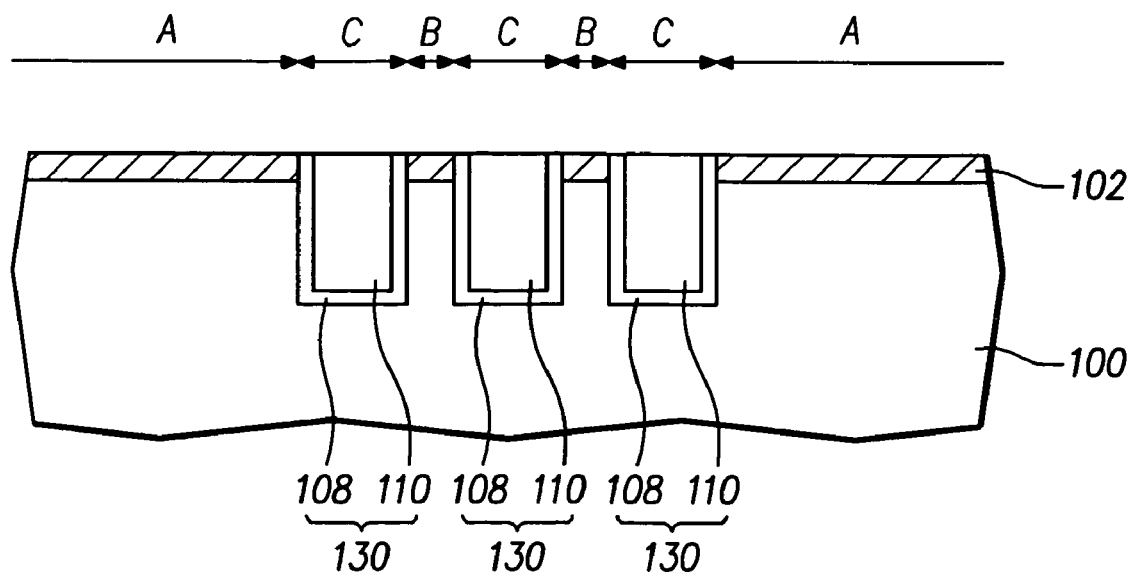
FIG. 1 is a cross-sectional view of an example shallow trench isolation structure in a semiconductor device fabricated by an example method performed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

EXAMPLE 1

FIG. 1 is a cross-sectional view of an example shallow trench isolation structure in a semiconductor device manufactured by an example method performed pursuant to the teachings of the present invention.

In the example of FIG. 1, a first oxide layer 102 is formed on a substrate 100. In addition, an element isolation region defining an active region is formed in a predetermined area of the first oxide layer 102 and the substrate 100. In an element isolation region C, a third oxide layer 108 and a fourth oxide layer 110 are formed respectively. An active region defined by the element isolation region C is divided into first and second regions A and B, whose widths depend on the size of the element isolation region C. In the illustrated example, the first region A is wider than the second region B.

An example method of forming the element isolation region is described in detailed with reference to the enclosed FIGS. 2a, 2b, 2c, and 2d.

Figure 2A:
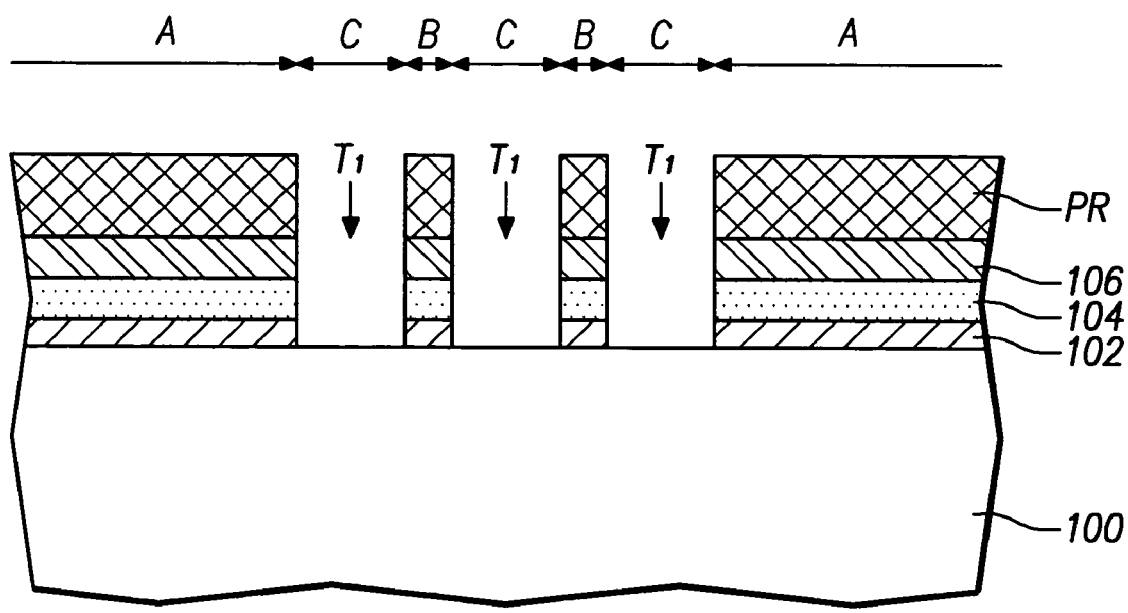
FIGS. 2a, 2b, and 2c are cross-sectional views of an example shallow trench isolation structure in a semiconductor device, illustrating in sequential order an example method performed in accordance with the teachings of the present invention.

As shown in FIG. 2a, a first oxide layer 102, a nitride layer 104, and a second oxide layer 106 are sequentially formed on a substrate 100. A photoresist pattern PR is formed on the second oxide layer 106. While using the photoresist pattern PR as a mask, a trench Ti is formed by etching the second oxide 106, the nitride layer 104, and the first oxide layer 102 until the substrate 100 is exposed. In the illustrated example, the photoresist pattern PR is formed to define first and second active regions A and B, and an element isolation region. The sizes of the active regions depend on the size of the semiconductor element to be formed thereon. In the illustrated example, the first active region A is wider than the second active region B.

Figure 2B:
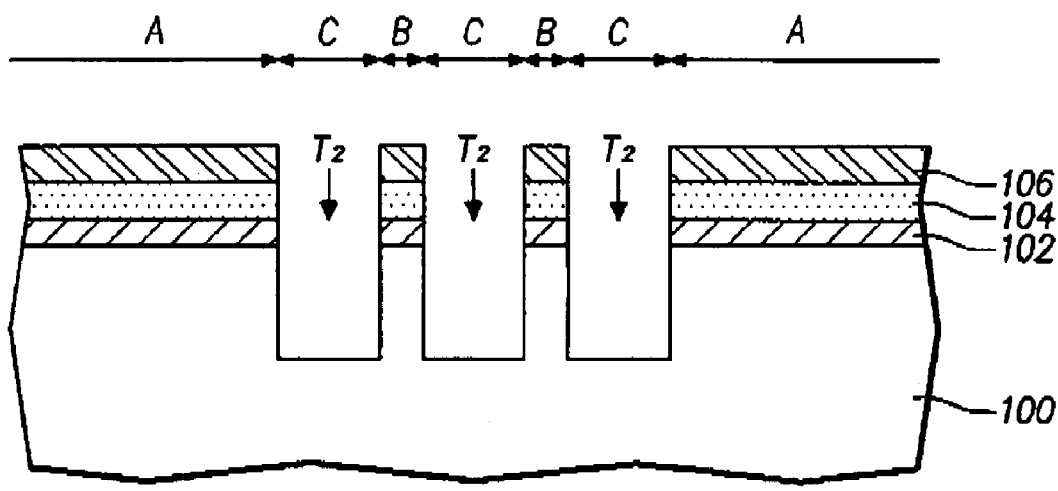

As shown in FIG. 2b, after the photoresist pattern PR is removed, a second trench T2 is formed by etching the exposed substrate 100 while using the second oxide layer 106 as a mask.

Figure 2C:
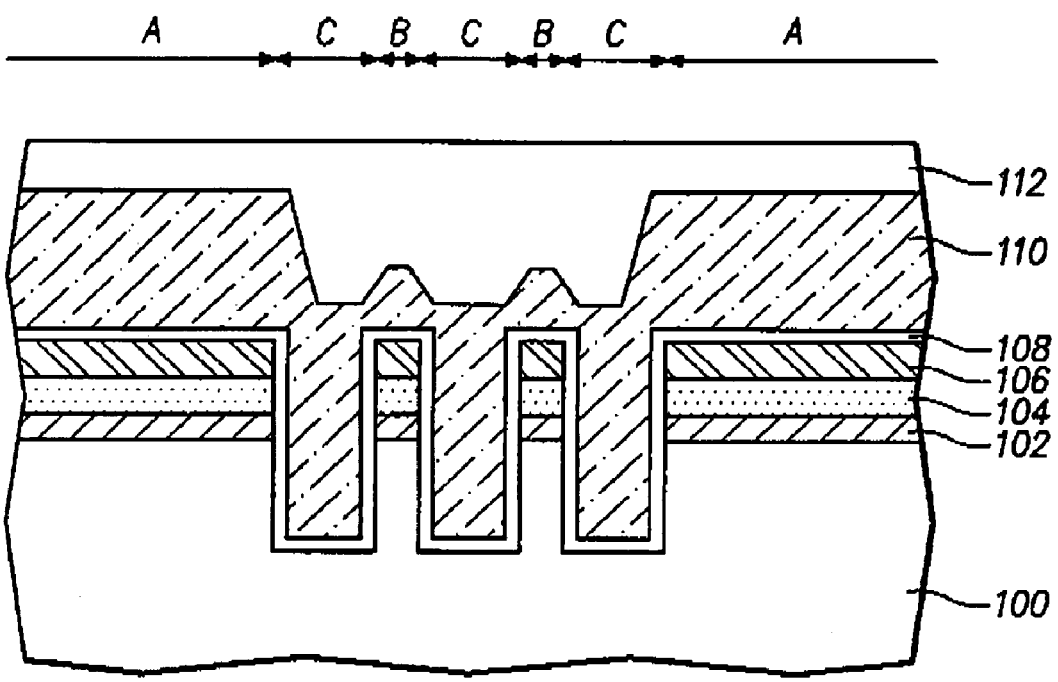

As shown in FIG. 2c, a third oxide layer 108 is formed on the entire surface of the substrate 100 and inside of the second trench T2. In the illustrated example, the third oxide layer 108 is formed of a TEOS (Tetra Ethyl Ortho Silicate) layer by performing a LPCVD (Low Pressure Chemical Vapor Deposition) method. In the illustrated example, the third oxide layer 108 is formed to have a thickness of about 10~200 Å. Next, the second trench T2 is filled with a fourth oxide layer 110 by performing an HDPCVD (High Density Plasma Chemical Vapor Deposition) method.

In order to form a sacrificial layer for a subsequent chemical mechanical polishing process, a sacrificial oxide layer 112 is formed on the substrate 100 by a SOG (Spin On Glass) method. A heat treatment is then carried out. The heat treatment is performed in an oxygen atmosphere at a high temperature over about 1,000° C. so that impurities on the surfaces of the sacrificial oxide layer 112 and the fourth oxide layer 110 are oxidized and removed.

As a result of forming the sacrificial oxide layer 112, the element isolation region adjacent the narrow active region B can be protected from damage because the narrow active region B is covered and the step between the narrow active region B and the wide active region A is minimized during a chemical mechanical polishing process. The reliability of the fabricated semiconductor device is improved because the heat treatment is performed after forming the sacrificial oxide layer for removal of the impurities.

Next, as shown in FIG. 1, the sacrificial oxide layer 112, the fourth oxide layer 110, the third oxide layer 108 and the second oxide layer 106 are removed by blanket etching so that the nitride layer 104 is exposed. Next, the nitride layer 104 is chemically and mechanically polished until the first oxide layer 102 is exposed so that the substrate 100 is planarized. Residues of the nitride layer 104 can be removed with phosphoric acid ($H_3PO_4$).

EXAMPLE 2

A semiconductor device manufactured by a second example method performed in accordance with the teachings of the present invention has generally the same resultant structure as a semiconductor device fabricated by the first example method described above. However, the second example method is different from the first example method. The second example method will now be described in detailed with reference to FIGS. 3a, 3b, 3c and 3d.

Figure 3A:
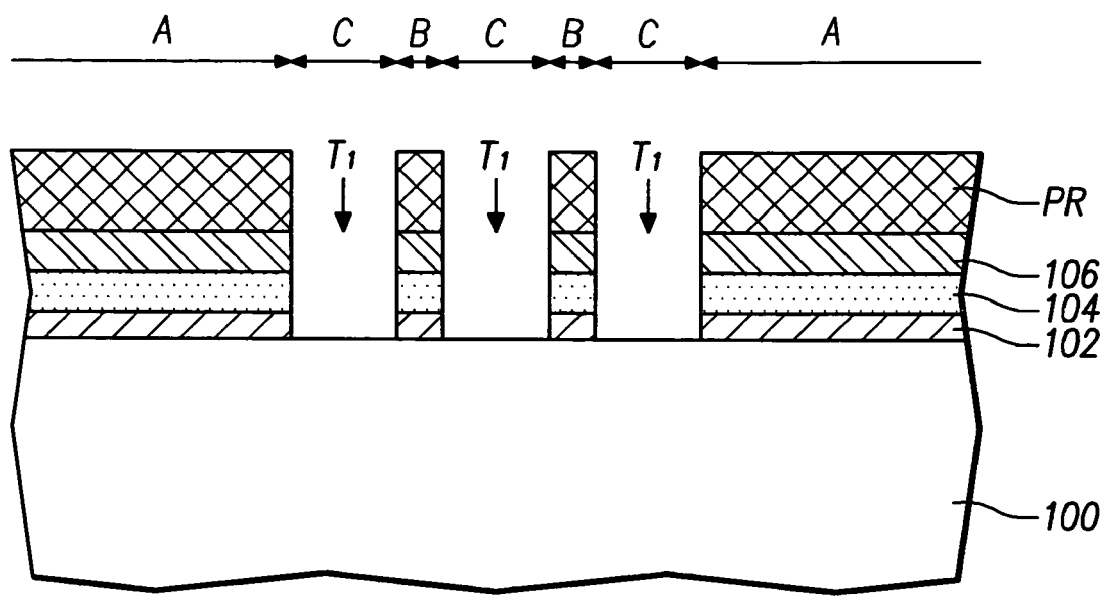
FIGS. 3a, 3b, 3c, and 3d are cross-sectional views of another example shallow trench isolation structure in a semiconductor, illustrating in sequential order another example method performed in accordance with the teachings of the present invention.

FIGS. 3a, 3b, 3c and 3d are cross-sectional views of shallow trench isolation structures in a semiconductor device manufactured by the second example method. As shown in FIG. 3a, a first oxide layer 102, a nitride layer 104, and a second oxide layer 106 are sequentially formed on a substrate 100. A photoresist pattern PR is formed on the second oxide layer 106. While using the photoresist pattern PR as a mask, the second oxide layer 106, the nitride layer 104, and the first oxide layer 102 are etched until the substrate 100 is exposed, so that a first trench T1 is formed. The sizes of the active regions depend on the size of a semiconductor element to be formed thereon. In the illustrated example, a first active region A is defined to be broader than a second active region B.

Figure 3B:
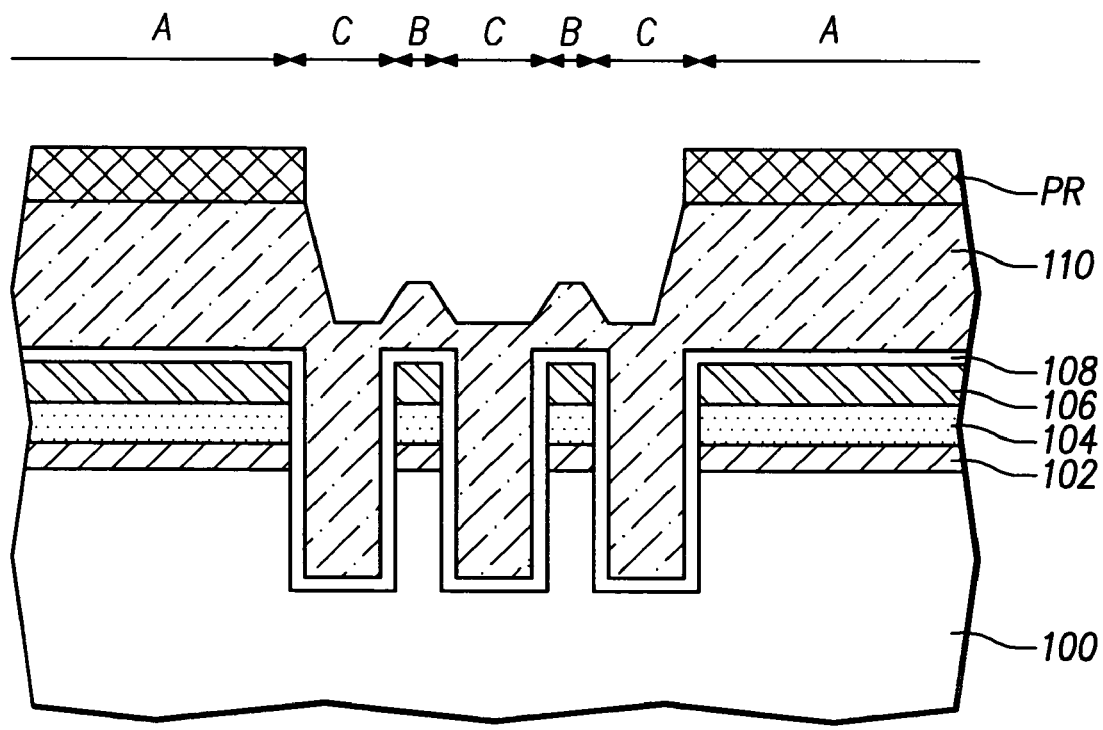

In the example of FIG. 3b, after the photoresist pattern PR is removed, a second trench is formed by etching the exposed substrate 100 while using the second oxide layer 106 as a mask. This second trench represents a similar area as the trench T2 of the first example shown in FIG. 2b.

A third oxide layer 108 is formed on the entire surface of the substrate 100 and inside the second trench. The third oxide layer 108 is formed of a TEOS (Tetra Ethyl Ortho Silicate) layer by performing a LPCVD (Low Pressure Chemical Vapor Deposition) method. The third oxide layer 108 is formed to have a thickness of about 10~200 Å. In addition, a fourth oxide layer 110 is formed by an HDPCVD (High Density Plasma Chemical Vapor Deposition) method to fill up the inside of the second trench. A photoresist pattern (PR) is then formed on the fourth oxide layer 110 in an area corresponding to the first active region A.

Figure 3C:
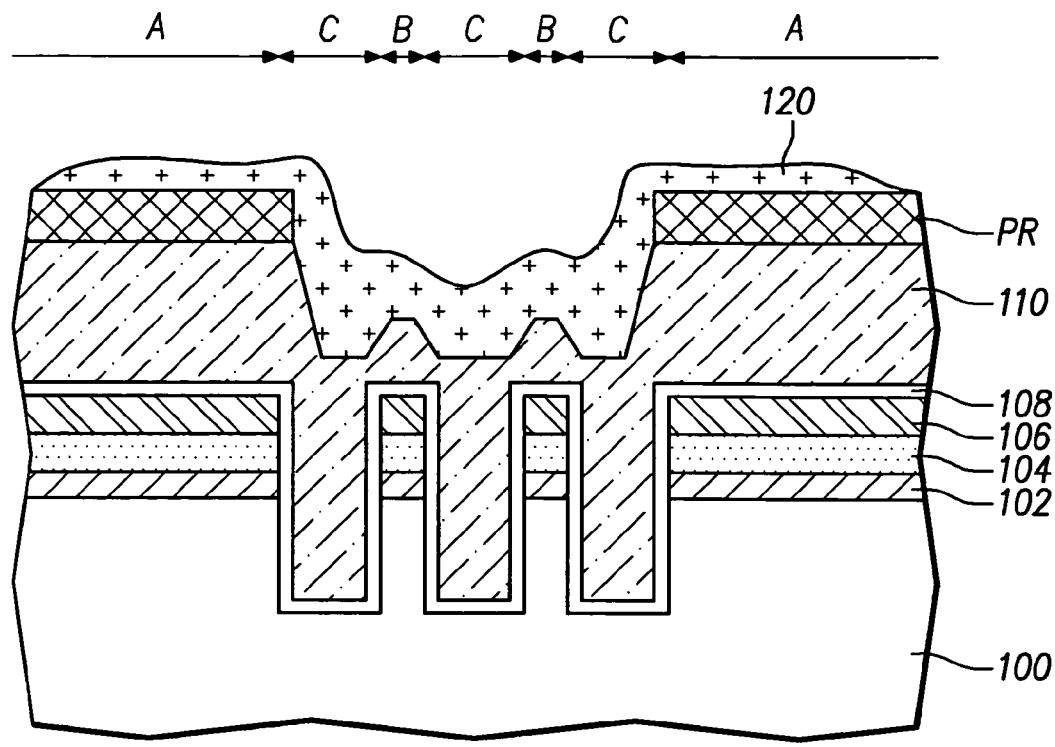

Next, as shown in FIG. 3c, in order to form a sacrificial layer for a chemical mechanical polishing (CMP) process, a sacrificial oxide layer 120 is formed over the entire surface of the substrate 100 performing a PECVD (Plasma Enhanced Chemical Vapor Deposition) at a low temperature of about 180~220° C. In the illustrated example, the sacrificial oxide layer 120 is formed by injecting the gases of $SiH_4$ and $O_2$, or the gases of TEOS and $O_2$ into the PECVD equipment. In consideration of the surface properties, the sacrificial oxide layer 120 can be thinly formed on the photoresist pattern PR in comparison with the other area.

Figure 3D:
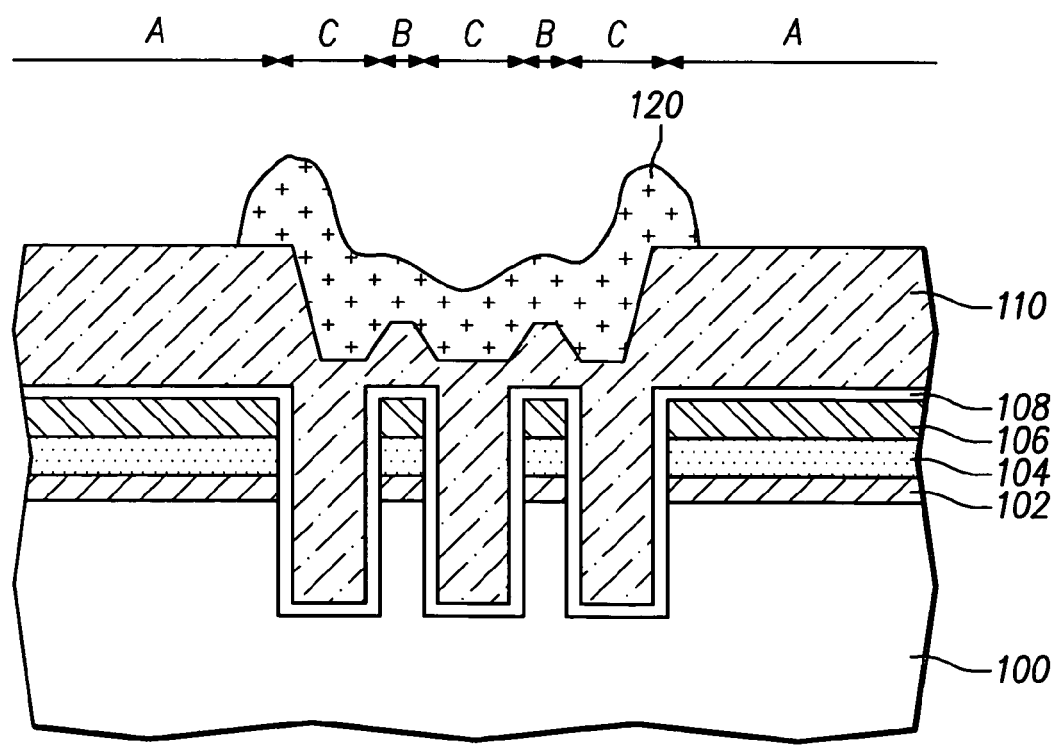

As shown is FIG. 3d, the photoresist pattern PR is removed with an alkaline solution so that the sacrificial oxide layer 120 remains only on the second active area B to continue to protect the second active area B.

As a result of further forming the sacrificial oxide layer 120, the element isolation region adjacent to the narrow active region B is protected from damage and the step between the narrow active region B and the wide active region A is minimized during a subsequent chemical mechanical polishing process.

Next, as shown in FIG. 1, the sacrificial oxide layer 120, the fourth oxide layer 110, the third oxide layer 108 and the second oxide layer 106 are removed so that the nitride layer 104 is exposed. Subsequently, the nitride layer 104 is chemically and mechanically polished until the first oxide layer 102 is exposed so that the entire structure is planarized. In addition, residues of the nitride layer 104 can be removed with phosphoric acid ($H_3PO_4$).

From the above description, persons of ordinary skill in the art will appreciate that high quality semiconductor devices have been provided wherein an element isolation region formed around a narrow active area can be protected by further forming a sacrificial oxide layer.

Persons of ordinary skill in the art will further appreciate that methods of forming shallow trench isolation structures in semiconductor devices which are capable of minimizing the damage of a narrow active area when forming an element isolation area through an STI process have been provided.

A disclosed example method of forming a shallow trench isolation structure in a semiconductor device comprises: forming a first oxide layer, a nitride layer, and a second oxide layer on a substrate; forming a trench defining first and second active areas by etching the second oxide layer, the nitride layer, the first oxide layer, and the substrate in a predetermined area; forming a third oxide layer inside of the trench; forming a fourth oxide layer filling the trench; forming a sacrificial oxide layer on the fourth oxide layer; and removing the sacrificial oxide layer, the fourth oxide layer, the third oxide layer, the second oxide layer, and the nitride layer to form the shallow trench isolation structure.

Another example method of forming a shallow trench isolation structure in a semiconductor device comprises: forming a first oxide layer, a nitride layer, and a second oxide layer on a substrate; forming a trench defining first and second active areas by etching the second oxide layer, the nitride layer, the first oxide layer, and the substrate in a predetermined area; forming a third oxide layer along an inside of the trench; forming a fourth oxide layer to fill up the trench; forming a photoresist pattern on the fourth oxide layer in an area corresponding with the first active area; forming a sacrificial oxide layer over an entire surface of the substrate and on the photoresist pattern; removing the photoresist pattern, the sacrificial oxide layer, the fourth oxide layer, the third oxide layer, the second oxide layer, and the nitride layer to form the shallow trench isolation.

The sacrificial oxide is preferable formed by a SOG (Spin On Glass) method. In an illustrated example, a heat treatment is performed after the sacrificial oxide is formed. The heat treatment is performed in an oxygen atmosphere, and at a temperature over about 1,000° C.

In addition, the sacrificial oxide is preferably formed by a PECVD (Plasma Enhanced Chemical Vapor Deposition) method.

In addition, the third oxide layer is preferably formed to have a thickness of about 10~100 Å.

In addition, the sacrificial oxide layer, the second oxide layer, the third oxide layer, and the fourth oxide layer are preferably removed by a blanket etching process.

In addition, the nitride layer is preferably removed by a chemical mechanical polishing process.

In an illustrated example, an etching process is performed using phosphohydric acid ($H_3PO_4$) after the chemical mechanical polishing process.

It is noted that this patent claims priority from Korean Patent Application Serial Number 2004-54327, which was filed on Jul. 13, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a shallow trench isolation structure in a semiconductor device comprising:

forming a first oxide layer, a nitride layer, and a second oxide layer above a substrate;

etching the second oxide layer, the nitride layer, the first oxide layer, and the substrate in a predetermined area to form a trench defining first and second active areas;

forming a third oxide layer inside of the trench;

filling the trench with a fourth oxide layer;

forming a photoresist pattern above the fourth oxide layer in an area corresponding to the first active area;

forming a sacrificial oxide layer over a resulting structure including over the photoresist pattern; and removing the photoresist pattern, the sacrificial oxide layer, the fourth oxide layer, the third oxide layer, the second oxide layer, and the nitride layer.

2. A method as defined in claim 1, wherein the sacrificial oxide layer is formed by a PECVD (Plasma Enhanced Chemical Vapor Deposition) method.

3. A method as defined in claim 2, wherein the PECVD method comprises injecting $SiH_4$ gas or TEOS gases, and $O_2$ gas into a PECVD equipment at a temperature of about 180~220° C.

4. A method as defined in claim 1, wherein the third oxide layer has a thickness of about 10~100 Å.

5. A method as defined in claim 1, wherein the sacrificial oxide layer, the fourth oxide layer, the, third oxide layer, and the second oxide layer are removed by blanket etching.

6. A method as defined in claim 1, wherein the nitride layer is removed by a chemical mechanical polishing process.

7. A method as defined in claim 6, further comprising performing an etching process using a acid ($H_3PO_4$) after performing the chemical mechanical polishing process.

\* \* \* \* \*